United States Patent
Huang et al.

(10) Patent No.: US 7,876,100 B2
(45) Date of Patent: Jan. 25, 2011

(54) METHOD AND APPARATUS FOR ACTIVELY CONTROLLING QUENCH PROTECTION OF A SUPERCONDUCTING MAGNET

(75) Inventors: Xianrui Huang, Clifton Park, NY (US); Minfeng Xu, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/567,846

(22) Filed: Sep. 28, 2009

(65) Prior Publication Data
US 2010/0013584 A1     Jan. 21, 2010

Related U.S. Application Data

(62) Division of application No. 11/621,537, filed on Jan. 9, 2007, now Pat. No. 7,615,998.

(51) Int. Cl.
*G01V 3/00* (2006.01)

(52) U.S. Cl. .................................................... 324/319
(58) Field of Classification Search .......... 324/300–322
See application file for complete search history.

(56) References Cited

U.S. PATENT DOCUMENTS

| | | | |
|---|---|---|---|
| 4,689,707 A * | 8/1987 | Schwall ............... | 361/19 |
| 4,994,935 A | 2/1991 | Takechi | |
| 6,037,850 A * | 3/2000 | Honmei et al. ....... | 335/216 |
| 6,147,844 A * | 11/2000 | Huang et al. ......... | 361/19 |
| 6,512,374 B1 | 1/2003 | Misic et al. | |
| 6,563,316 B2 * | 5/2003 | Schauwecker et al. .. | 324/318 |
| 6,621,413 B1 | 9/2003 | Roman et al. | |
| 6,735,848 B1 | 5/2004 | Markiewicz et al. | |
| 6,783,059 B2 | 8/2004 | Laskaris et al. | |
| 6,960,914 B2 | 11/2005 | Shen et al. | |
| 6,977,571 B1 | 12/2005 | Hollis et al. | |
| 7,015,779 B2 | 3/2006 | Markiewicz et al. | |
| 7,116,535 B2 | 10/2006 | Huang | |
| 7,161,777 B2 | 1/2007 | Tsuchiya et al. | |

(Continued)

FOREIGN PATENT DOCUMENTS

EP     1612904 A2     1/2006

(Continued)

OTHER PUBLICATIONS

Orris et al., "A Digital Quench Detection System for Superconducting Magnets", Proceedings of the 1999 Particle Accelerator Conference, IEEE, New York, pp. 3191-3193, 1999.

(Continued)

*Primary Examiner*—Melissa J Koval
*Assistant Examiner*—Dixomara Vargas
(74) *Attorney, Agent, or Firm*—Jason K. Klindtworth

(57) ABSTRACT

A method and apparatus for actively controlling quench protection of a superconducting magnet includes a magnetic resonance imaging (MRI) system and a computer readable storage medium having stored thereon a computer program comprising instructions which when executed by a computer cause the computer to detect a quench condition of the superconducting magnet. The instructions also cause the computer to actively control a quench protection system of the superconducting magnet in response to the detected quench condition.

7 Claims, 5 Drawing Sheets

U.S. PATENT DOCUMENTS

| | | | |
|---|---|---|---|
| 7,196,883 B2 | 3/2007 | Tsuchiya et al. | |
| 7,342,757 B2 | 3/2008 | Huang et al. | |
| 7,408,350 B2 | 8/2008 | Bittner | |
| 7,474,515 B2 * | 1/2009 | Mallett | 361/19 |
| 7,615,998 B2 * | 11/2009 | Huang et al. | 324/319 |
| 2006/0291112 A1 | 12/2006 | Markiewicz | |

FOREIGN PATENT DOCUMENTS

| | | |
|---|---|---|
| JP | 9260130 A | 10/1997 |
| JP | 2006319139 A | 11/2006 |
| JP | 2008168121 A * | 7/2008 |

OTHER PUBLICATIONS

Nogiec et al., "Architecture of a Software Quench Management System", Proceedings of the 2001 Particle Accelerator Conference, Chicago, IL, IEEE, pp. 3460-3462, 2001.
GB Search Report dated Mar. 19, 2008.
GB Search Report dated May 17, 2010.

* cited by examiner

METHOD AND APPARATUS FOR ACTIVELY CONTROLLING QUENCH PROTECTION OF A SUPERCONDUCTING MAGNET

CROSS REFERENCE TO RELATED APPLICATIONS

This application is a Divisional of U.S. patent application Ser. No. 11/621,537, filed Jan. 9, 2007 now U.S. Pat. No. 7,615,998, entitled METHOD AND APPARATUS FOR ACTIVELY CONTROLLING QUENCH PROTECTION OF A SUPERCONDUCTING MAGNET.

BACKGROUND OF THE INVENTION

The invention relates generally to superconducting magnet systems and, more particularly, to a quench protection system of a superconducting magnet system.

In one example, an MR system includes a cold mass comprises a superconducting magnet, a magnet coil support structure, and a helium vessel. Liquid helium contained in the helium vessel provides cooling for the superconducting magnet and maintains the superconducting magnet at a low temperature for superconducting operations, as will be understood by those skilled in the art. The liquid helium maintains the superconducting magnet approximately and/or substantially at the liquid helium temperature of 4.2 Kelvin (K). For thermal isolation, the helium vessel that contains the liquid helium in one example comprises a pressure vessel inside a vacuum vessel.

An MR superconducting magnet typically includes several coils, a set of primary coils that produce a uniform B0 field at the imaging volume, and a set of bucking coils that limit the fringe field of the magnet. These coils are wound with superconductors such as NbTi or Nb3Sn conductors. The magnet is cooled down to liquid helium temperature (4.2 K) so that the conductors are operated at their superconducting state. The heat loads of the magnet, such as that produced by the radiation and conduction from the environment, are removed by either the boil-off of liquid helium in an "open system" or by a 4 K cryocooler in a "closed system". The magnet is typically placed in a cryostat to minimize its heat loads since the replacement of liquid helium is expensive and since the cooling power of a cryocooler is limited.

One concern in superconducting magnet operation is that of the discontinuance or quenching of superconducting operation, which can produce voltages possibly damaging to the superconducting magnet or which can produce over-heating in the superconducting magnet. Quenching occurs when an energy disturbance, such as from a magnet coil frictional movement, heats a section of superconducting wire, raising its temperature above the critical temperature of superconducting operation. The heated section (normal zone) of wire becomes normal with some electrical resistance. The resulting $I^2R$ Joule heating further raises the temperature of the normal zone and increases the normal zone size. An irreversible action called a quench then occurs in which the electromagnetic energy of the superconducting magnet is quickly dumped or converted into thermal energy through the increased Joule heating. In order to provide the required magnetic field homogeneity in the imaging volume for MRI operation the magnet coil is divided into a plurality of sub-coils spaced along and around the axis of the superconducting magnet such that they are not thermally connected. As a result, when one of the superconducting coils quenches, the entire magnetic energy may be dumped into the section of the quenching coil causing a hot spot and possible damage to the coil unless a suitable quench system provides protection which can be accomplished by quenching the other coils.

A conventional superconducting magnet system 2 employs a passive quench protection system 4 as schematically shown in FIG. 1. Superconducting magnet system 2 includes a plurality of superconducting magnet coils 6 electrically connected in series. A superconducting switch 8 is electrically connected in parallel with the plurality of superconducting magnet coils 6. As illustrated, the passive quench protection system 4 includes a plurality of resistive shunts 10 to shunt pairs of superconducting magnet coils 6. However, each resistive shunt 10 may be connected to less or more than the pair of superconducting magnet coils 6 as shown. When a superconducting magnet coil 6 quenches, the resistive shunt 10 connected thereto will allow the current of the superconducting magnet coil 6 to decay faster than the other superconducting magnet coils 6. The voltage developed in a quenching superconducting magnet coil 6 will heat the heaters 9 imbedded in other coils 6 to spread the normal zones, convert the magnetic energy into heat over a large volume of the superconducting coils 6, and thus protect the superconducting magnet system 2.

However, the internal resistive loops formed, in part, by the plurality of resistive shunts 10 may be magnetically coupled with external fields and external field changes such as gradient coil operations in an MRI system or moving metal disturbances. When magnetically coupled to external fields, currents will be induced in the internal resistive loops and resistive shunts 10. These currents can create inhomogeneous magnetic field generated by the plurality of superconducting magnet coils 6. Further, the currents decay over time by the resistance in the internal resistive loops. In an MRI system, an inhomogeneous magnetic field in the imaging volume and a current decay over time may adversely affect the imaging quality of the MRI system. Moreover, the currents in the superconducting magnet coils 6 can be very different during a quench, which may result in a sharp increase in the fringe field of the superconducting magnet to cause fringe field blooming artifacts.

It would therefore be desirable to have a system capable of protecting a superconducting magnet during a quench without the use of internal resistive loops.

BRIEF DESCRIPTION OF THE INVENTION

The present invention provides a system of superconducting magnet quench protection that overcomes the aforementioned drawbacks.

According to an aspect of the present invention, an MRI apparatus includes a magnetic resonance imaging (MRI) system having a plurality of gradient coils positioned about a bore of a superconducting magnet to impress a polarizing magnetic field and an RF transceiver system and an RF switch controlled by a pulse module to transmit RF signals to an RF coil assembly to acquire MR images. The superconducting magnet includes a plurality of superconducting magnet coils. The MRI apparatus also includes a computer readable storage medium having stored thereon a computer program comprising instructions which when executed by a computer cause the computer to detect a quench condition of the superconducting magnet. The instructions also cause the computer to actively control a quench protection system of the superconducting magnet in response to the detected quench condition.

According to another aspect of the present invention, a method of actively quenching a superconducting magnet includes detecting a quench voltage in a first portion of a superconducting magnet and energizing a quench protection system thermally connected to a second portion of the superconducting magnet. The method also includes heating the second portion of the superconducting magnet via the energized quench protection system to a temperature greater than a superconducting temperature of the superconducting magnet.

According to a further aspect of the present invention, a superconducting magnet system includes a superconducting magnet and at least one heater in thermal contact with the superconducting magnet. The system also includes a heater power source and an electrical bridge having an input configured to cause the electrical bridge to make and break an electrical connection between the at least one heater and the heater power source. A controller is coupled to the superconducting magnet and coupled to the input.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
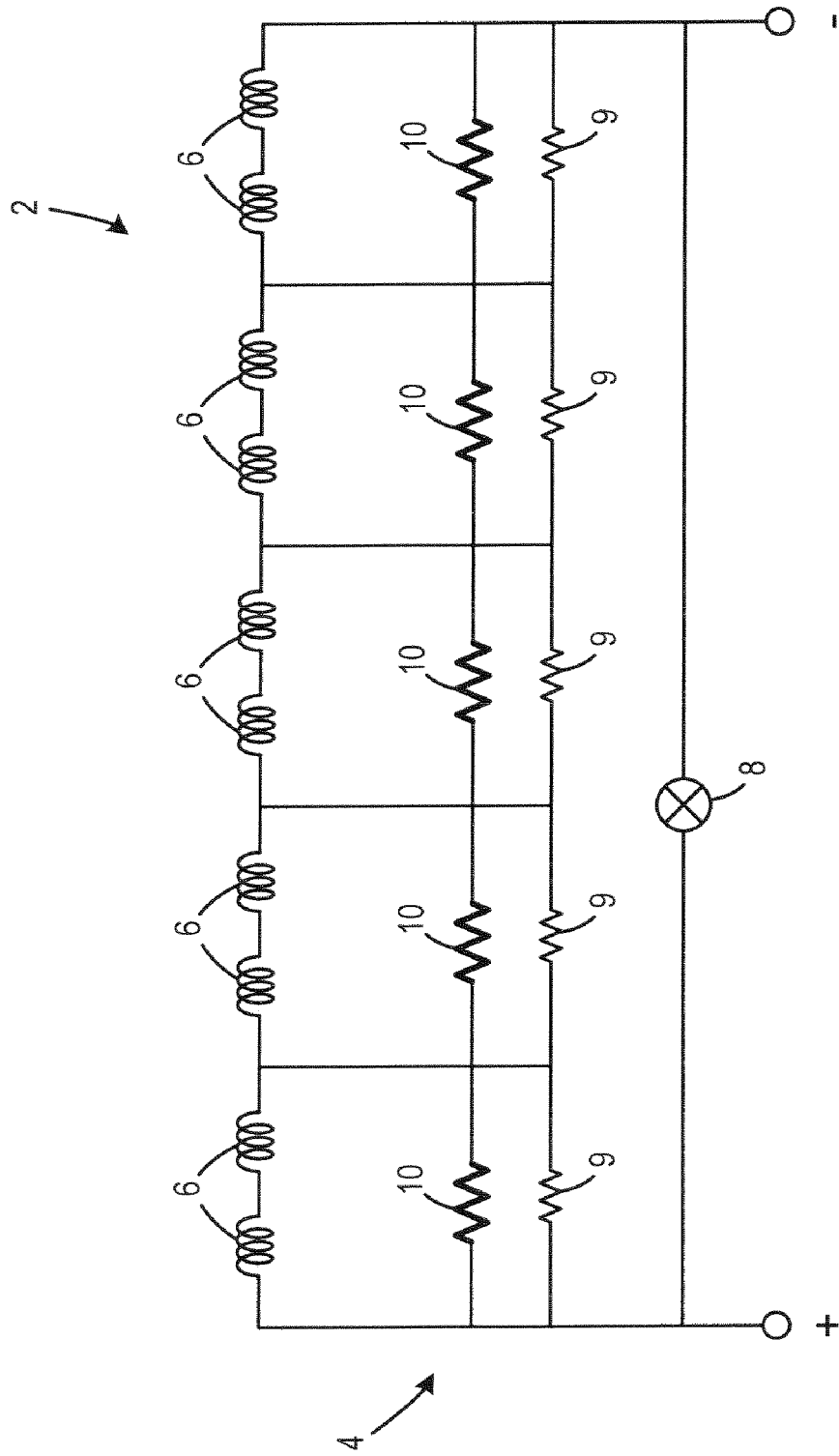
FIG. 1 is a schematic block diagram of a known passive quench protection system.
Figure 2:
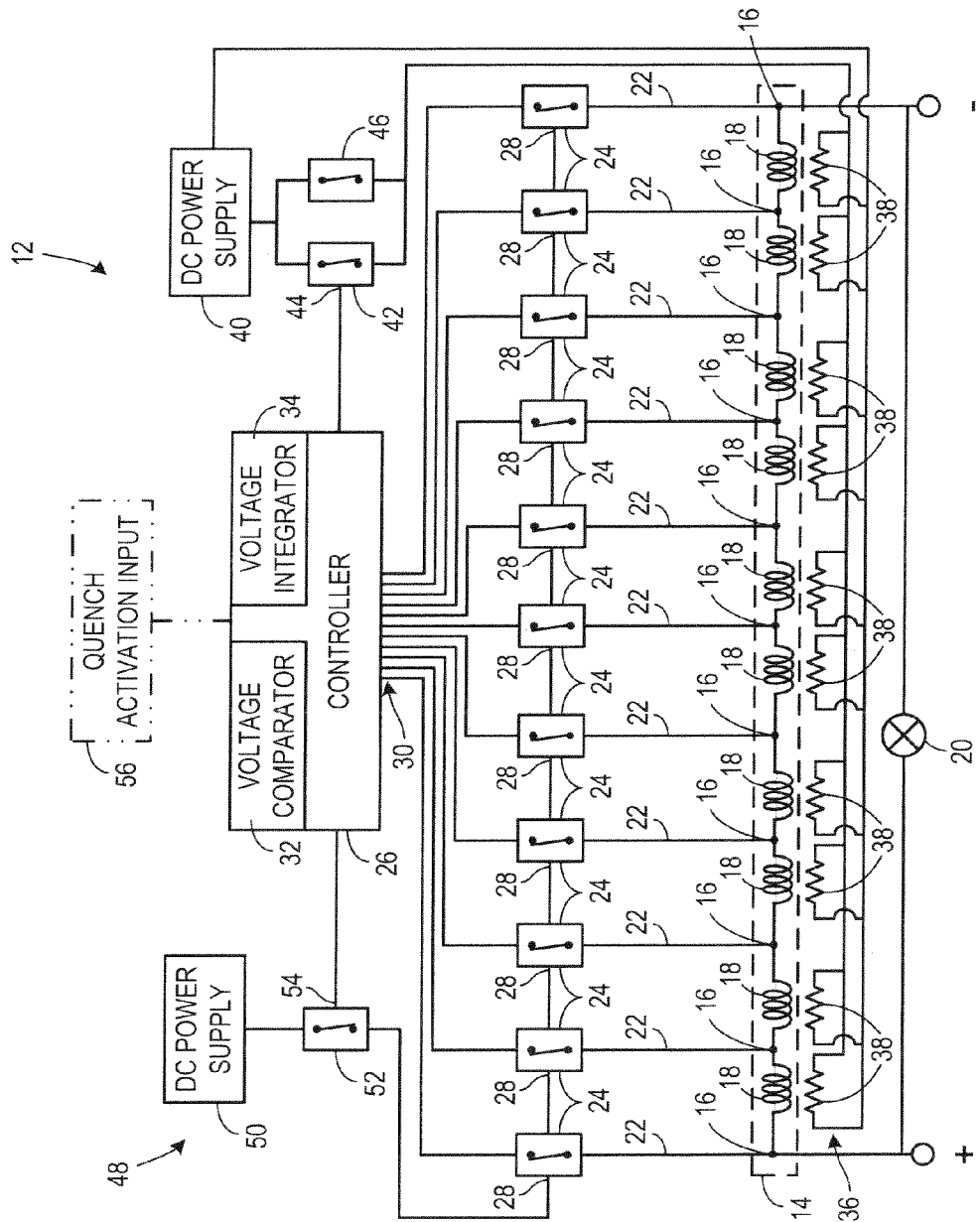
FIG. 2 is a schematic block diagram of an active quench protection circuit according to an embodiment of the present invention.

Referring to FIG. 2, an active quench protection circuit 12 is schematically shown coupled to a superconducting magnet 14 according to an embodiment of the present invention. Superconducting magnet 14 includes a plurality of superconducting magnet coils 18 electrically connected in series. A superconducting switch 20 is electrically connected in parallel with the superconducting magnet 14.

According to an embodiment of the present invention, a plurality of voltage taps 22 are electrically connected to the superconducting magnet 14 at nodes 16. In a preferred embodiment, each node 16 is tapped such that a voltage across adjacent voltage taps 22 represents the voltage across one coil 18. However, it is contemplated that less than all the nodes 16 may be tapped, for example, every other node 16, such that a voltage across adjacent voltage taps 22 represents the voltage across multiple coils 18.

A plurality of electrical bridges 24 electrically connect and disconnect a controller 26 to the plurality of voltage taps 22. It is contemplated that the plurality of electrical bridges 24 may be electromechanical switches (i.e., a contactor, a relay, and the like), solid-state switches (i.e., a transistor, a silicon controlled rectifier, a metal oxide semiconductor device, and the like), or a combination of both. Each electrical bridge 24 has an input 28 for controlling operation thereof. In this manner, each electrical bridge 24 may be controlled to make or break an electrical connection between the controller 26 and a corresponding voltage tap 22 connected thereto. In a preferred embodiment, controller 26 has a plurality of inputs 30, each electrically connected to an electrical bridge 24. However, it is contemplated that an electrical bus may connect controller 26 to electrical bridges 24. Preferably, there is a large impedance between inputs 30 so that currents induced in the superconducting coils by controller 26 are negligibly small.

A heating system 36 includes a plurality of heaters 38 thermally connected to the plurality of superconducting magnet coils 18. A DC power supply 40 provides power to energize the heaters 38. An electrical bridge 42 having an input 44 is electrically connected in series with the DC power supply 40 and the electrical bridge 42. Controller 26 is coupled to input 44 for electronic control of the heating system 36. Additionally, a manual switch 46 may be coupled in parallel with the electrical bridge 42 for manual control of the heating system 36. In another embodiment, a quench activation input 56 (shown in phantom) may be coupled to controller 26 for controlling heating system 36 such that an activation signal triggered by a user or by another system may be input into controller 26 to cause the controller 26 to activate heating system 36.

A control system 48 for controlling inputs 28 of electrical bridges 24 includes a DC power supply 50 coupled to an electrical bridge 52 having an input 54 coupled to controller 26. Electrical bridge 52 is further coupled to electrical bridge inputs 28.

Controller 26 includes a voltage comparator 32 and a voltage integrator 34. It is contemplated that voltage comparator 32 and voltage integrator 34 may perform analog or digital operations. Controller 26 uses voltage comparator 32 and voltage integrator 34 in determining a quench condition in the superconducting magnet 14 as described hereinbelow with respect to FIGS. 3 and 4. Where appropriate, references to that shown in FIG. 2 will be identified by the reference numerals of FIG. 2.

Figure 3:
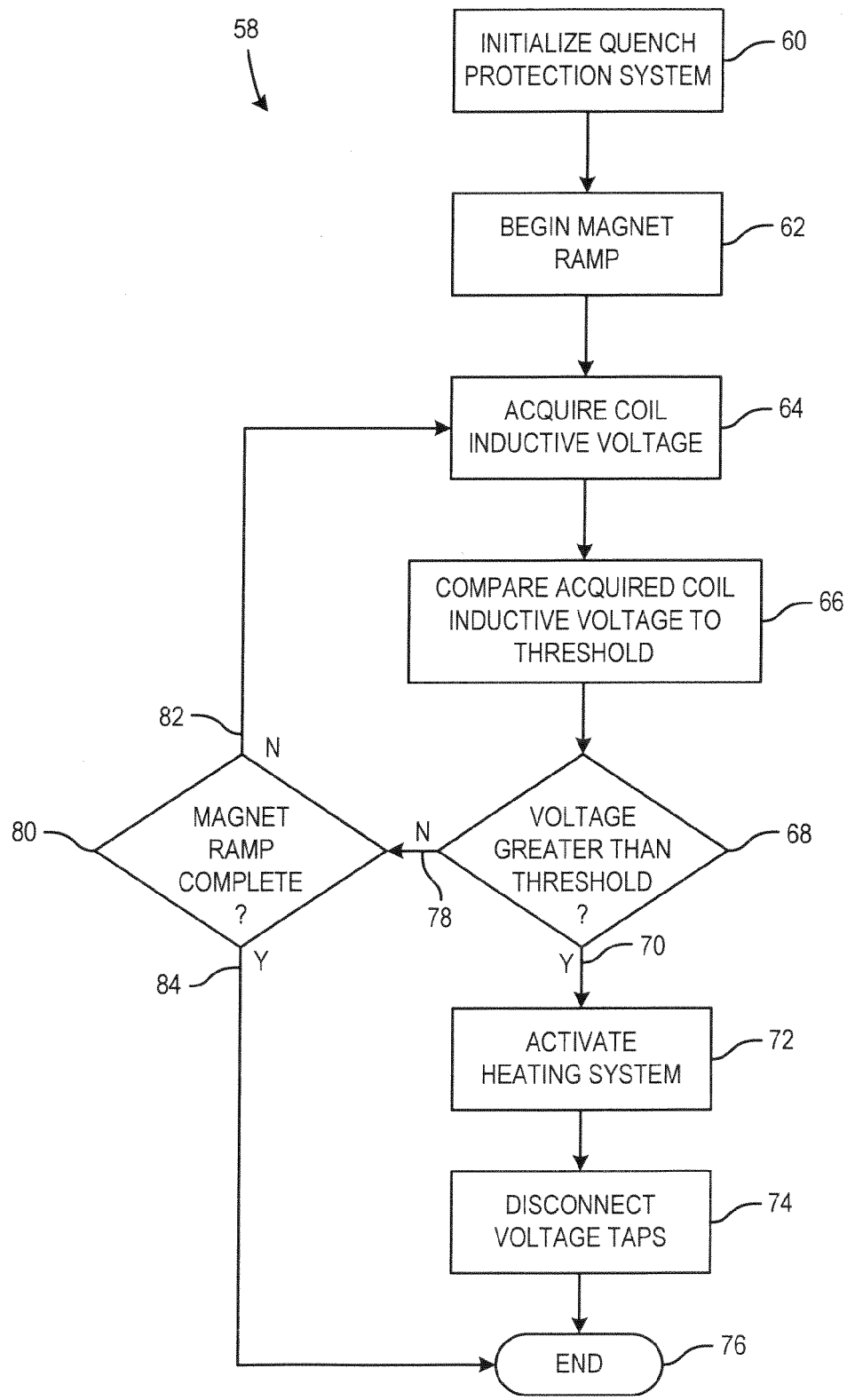
FIG. 3 is a quench protection technique for use during ramping of a superconducting magnet according to an embodiment of the present invention.

FIG. 3 shows a quench protection technique 58 for use during ramping of superconducting magnet 14 toward superconducting operations according to an embodiment of the present invention. Technique 58 begins by initializing 60 the quench protection circuit 12. Initialization includes causing electrical bridges 24 to couple the plurality of voltage taps 22 to controller 26 if needed and causing electrical bridge 42 to de-activate the heating system 36 if needed. Magnet ramping 62 then begins to ramp superconducting magnet 14 toward superconducting operations.

During the magnet ramp, the inductive voltage in the coils 18 is acquired 64. In a preferred embodiment, the inductive voltage is acquired for each coil 18; however, it is contemplated that the inductive voltage across multiple coils 18 may be acquired. After each inductive voltage is acquired 64, the inductive voltage is compared 66 to a threshold via voltage comparator 32. In one embodiment, the configuration of the superconducting magnet 14 causes typical coil induced voltages to be 1 V or less during magnet ramping. In other embodiments, typical coil induced voltages may be more or less than 1 V. A threshold of at least ten times the typical coil induced voltage for a given configuration allows fluctuation of the induced coil voltage below the threshold in the case where the superconducting magnet 14 is not in a quench condition. In the case where the superconducting magnet 14 is in a quench condition, the induced coil voltage should quickly rise above the threshold.

Following the comparison 66, technique 58 determines 68 whether the induced coil voltage in any coil 18 is greater than the threshold. A quench will be detected if the induced coil voltage for a coil 18 is greater than the threshold. If the induced coil voltage for a coil 18 is greater than the threshold 70, the heating system 36 is activated 72. Accordingly, controller 26 controls electrical bridge 42 to couple the DC power supply 40 to the plurality of heaters 38. All coils 18 including the affected coil 18 under quench are heated to a temperature greater than a superconducting temperature of the superconducting magnet via the plurality of heaters 38 thermally connected thereto. During a magnet quench, the voltages in the coils 18 can rise to a very high level. Therefore, in addition to activation of the heating system, the voltage taps 22 are de-coupled 74 from controller 26. Accordingly, controller 26 controls electrical bridge 52 such that electrical bridges 24 de-couple the plurality of voltage taps 22 from controller 26. Technique 58 then ends 76.

If the induced coil voltage for a coil 18 is not greater than the threshold 80, no quench is detected, and technique 58 determines 82 if magnet ramping is complete, and if not 84, technique 58 returns to block 64, and technique 58 continues as described above. If magnet ramping is complete yes 86, technique 58 ends 76.

Figure 4:
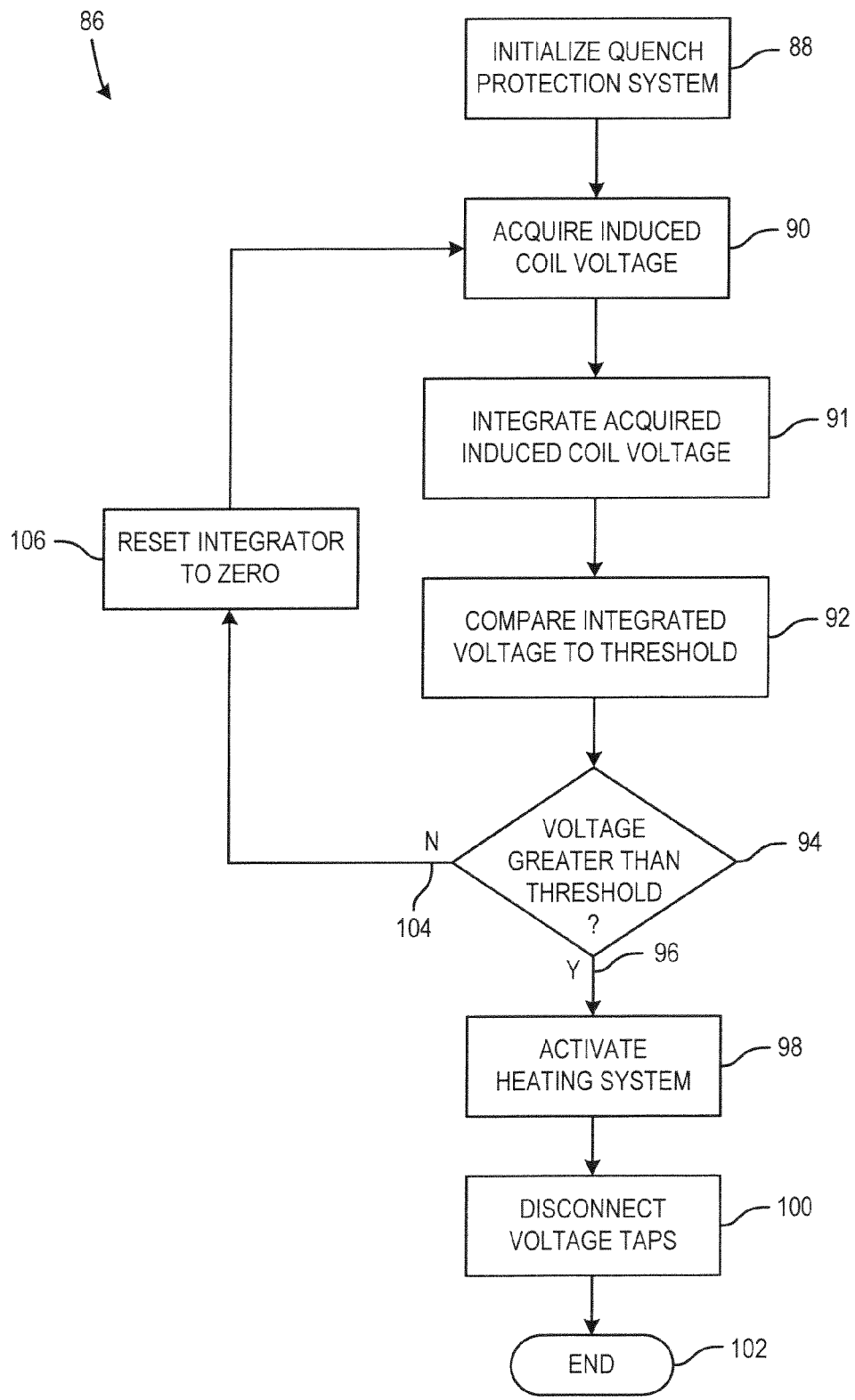
FIG. 4 is a quench protection technique for use during superconducting operations of a superconducting magnet according to an embodiment of the present invention.

FIG. 4 shows a quench protection technique 86 for use during superconducting operations of superconducting magnet 14 according to an embodiment of the present invention. Technique 86 begins by initializing 88 the quench protection circuit 12. Initialization includes causing electrical bridges 24 to couple the plurality of voltage taps 22 to controller 26 if needed and causing electrical bridge 42 to de-activate the heating system 36 if needed.

During normal superconducting operations, a voltage induced in superconducting magnet 14 is acquired 90. In a preferred embodiment, voltages induced in each coil 18 are acquired 90; however, it is contemplated that an induced voltage across multiple coils 18 may be acquired. After the induced voltage is acquired 90, the induced voltage is preferably integrated 91 by voltage integrator 34. Voltages induced in the magnet coils 18 during normal superconducting operations may include, for example, a 0.1 Hz range signal waveform caused by moving metal, a signal waveform in the 10s Hz range caused by vibration, or a signal waveform in the 100s Hz range caused by a gradient pulse, such as a gradient pulse of an MRI system. Typically, such induced voltages are low, i.e., for moving metal and vibration, or the duration time is short, i.e., for a gradient pulse. Accordingly, an integrated value of such induced voltages using the equation, $$\Sigma Vdt \quad \text{(Eqn. 1)},$$

will typically be 0.01 Vs or less. In contrast, a quench voltage is a fast rising voltage from the fast rising resistance of the normal zone. An integrated value of an acquired quench voltage using Eqn. 1 will typically be greater than 0.1 Vs.

Technique 86 compares 92 the integrated voltage to a threshold via voltage comparator 32. A quench will be detected if the integrated coil voltage for a coil 18 is greater than the threshold. Preferably, the threshold is set to a value of 0.1 Vs or 0.2 Vs. Following the comparison 92, technique 86 determines 94 whether the integrated voltage in any coil 18 is greater than the threshold. If any integrated voltage is greater than the threshold 96, the heating system 36 is activated 98. Accordingly, controller 26 controls electrical bridge 42 to couple the DC power supply 40 to the plurality of heaters 38. All coils 18 including the affected coil 18 under quench are heated to a temperature greater than a superconducting temperature of the superconducting magnet via the plurality of heaters 38 thermally connected thereto. During a magnet quench, the voltages in the coils 18 can rise to a very high level. Therefore, in addition to activation of the heating system, the voltage taps 22 are de-coupled 100 from controller 26. Accordingly, controller 26 controls electrical bridge 52 such that electrical bridges 24 de-couple the plurality of voltage taps 22 from controller 26. Technique 86 then ends 102.

If no integrated voltage is greater than the threshold 104, no quench is detected, and technique 86 resets 106 the voltage integrator 34 to zero to reduce DC drift. If the voltage integrator 34 is a digital integrator, a moving average technique may be employed. In the moving average technique, new voltage data is acquired across one or more coils 18, and the data acquired that is more recent than, for example, five seconds is averaged while the remaining data is discarded. If the voltage integrator 34 is an analog integrator, inputs to the voltage integrator 34 may be shorted together by closing a switch thereacross. Following the integrator reset 106, technique 86 returns to block 90 and technique 86 continues as described above.

Figure 5:
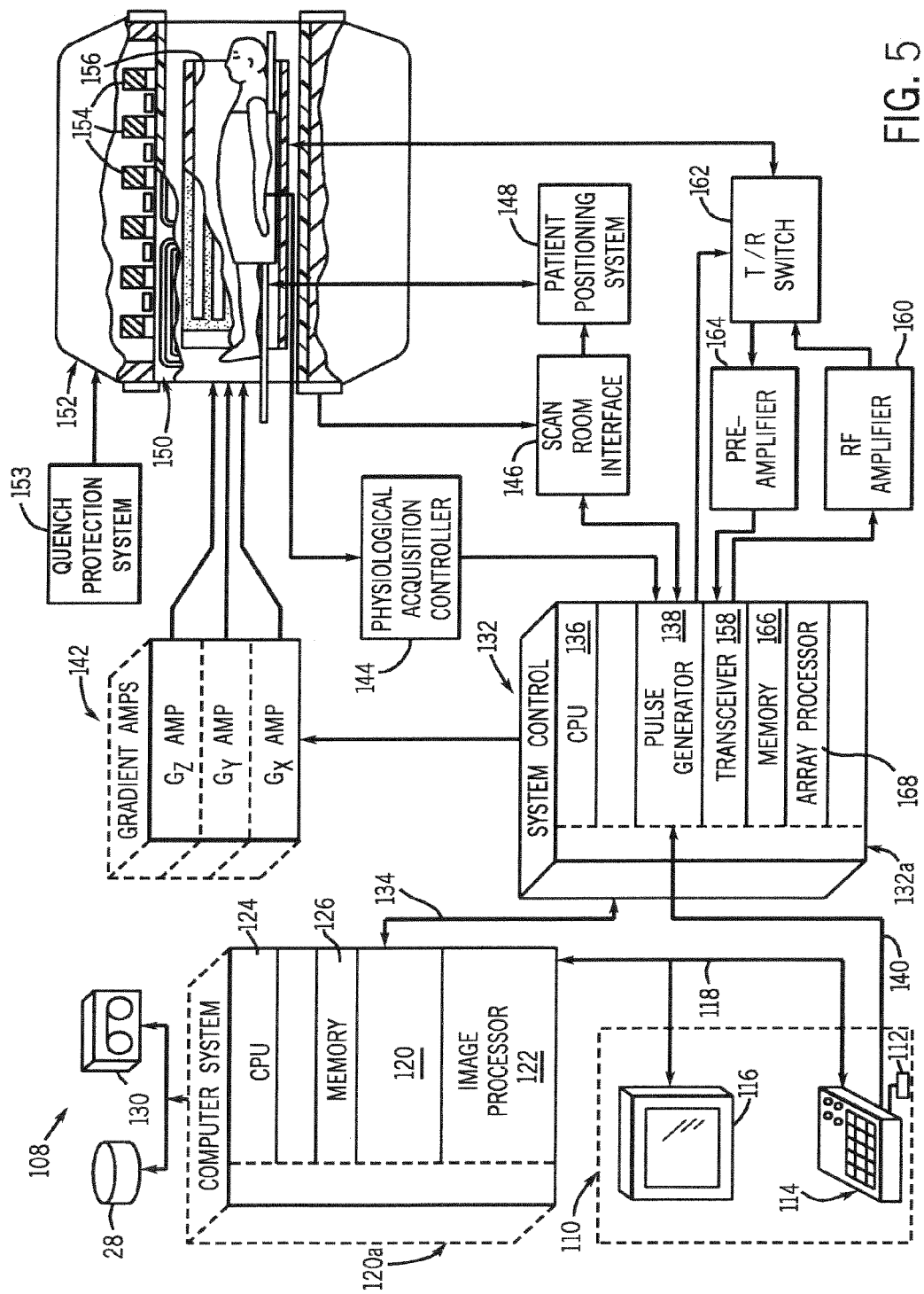
FIG. 5 is a schematic block diagram of an MR imaging system incorporating the present invention.

Referring now to FIG. 5, it is contemplated that the quench protection circuit 12 may be particularly applicable, but not limited to actively protecting superconducting coils of an MR imaging system 108. As is well known, operation of the MR imaging system 108 is controlled from an operator console 110 which includes a keyboard or other input device 111, a control panel 112, and a display screen 114. The console 110 communicates through a link 116 with a separate computer system 118 that enables an operator to control the production and display of images on the display screen 114. The computer system 118 includes a number of modules which communicate with each other through a backplane 120a. These include an image processor module 120, a CPU module 122 and a memory module 124, known in the art as a frame buffer for storing image data arrays. The computer system 118 is linked to disk storage 126 and removable storage 128 for storage of image data and programs, and communicates with a separate system control 130 through a high speed serial link 132. The input device 111 can include a mouse, joystick, keyboard, track ball, touch activated screen, light wand, voice control, or any similar or equivalent input device, and may be used for interactive geometry prescription.

The system control 130 includes a set of modules connected together by a backplane 132a. These include a CPU module 134 and a pulse generator module 136 which connects to the operator console 110 through a serial link 138. It is through link 138 that the system control 130 receives commands from the operator to indicate the scan sequence that is to be performed. The pulse generator module 136 operates the system components to carry out the desired scan sequence and produces data which indicates the timing, strength and shape of the RF pulses produced, and the timing and length of the data acquisition window. The pulse generator module 136 connects to a set of gradient amplifiers 140, to indicate the timing and shape of the gradient pulses that are produced during the scan. The pulse generator module 136 can also receive patient data from a physiological acquisition controller 142 that receives signals from a number of different sensors connected to the patient, such as ECG signals from electrodes attached to the patient. And finally, the pulse generator module 136 connects to a scan room interface circuit 144 which receives signals from various sensors associated with the condition of the patient and the magnet system. It is also through the scan room interface circuit 144 that a patient positioning system 146 receives commands to move the patient to the desired position for the scan.

The gradient waveforms produced by the pulse generator module 136 are applied to the gradient amplifier system 140 having Gx, Gy, and Gz amplifiers. Each gradient amplifier excites a corresponding physical gradient coil in a gradient coil assembly generally designated 148 to produce the magnetic field gradients used for spatially encoding acquired signals. The gradient coil assembly 148 forms part of a magnet assembly 150 which includes a polarizing magnet 152 and a whole-body RF coil 154. A quench protection system 153 in accordance with an embodiment of the present invention is coupled to polarizing magnet 152. A transceiver module 156 in the system control 130 produces pulses which are amplified by an RF amplifier 158 and coupled to the RF coil 154 by a transmit/receive switch 160. The resulting signals emitted by the excited nuclei in the patient may be sensed by the same RF coil 154 and coupled through the transmit/receive switch 160 to a preamplifier 162. The amplified MR signals are demodulated, filtered, and digitized in the receiver section of the transceiver 156. The transmit/receive switch 160 is controlled by a signal from the pulse generator module 136 to electrically connect the RF amplifier 158 to the coil 154 during the transmit mode and to connect the preamplifier 162 to the coil 154 during the receive mode. The transmit/receive switch 160 can also enable a separate RF coil (for example, a surface coil) to be used in either the transmit or receive mode.

The MR signals picked up by the RF coil 154 are digitized by the transceiver module 156 and transferred to a memory module 164 in the system control 130. A scan is complete when an array of raw k-space data has been acquired in the memory module 164. This raw k-space data is rearranged into separate k-space data arrays for each image to be reconstructed, and each of these is input to an array processor 166 which operates to Fourier transform the data into an array of image data. This image data is conveyed through the serial link 132 to the computer system 118 where it is stored in memory, such as disk storage 126. In response to commands received from the operator console 110, this image data may be archived in long term storage, such as on the removable storage 128, or it may be further processed by the image processor 120 and conveyed to the operator console 110 and presented on the display 114.

The present invention advantageously provides a method and apparatus to remove resistive loops internal to the coils of a superconducting coil for quench protection. In this manner, the superconducting coils react to external magnetic fields as a whole circuit. Since the loop is superconducting, the reaction will be purely inductive, and there is no current decay due to resistance. Furthermore, the field introduced by the induced current affects the whole $B_0$ field in the imaging volume. During a quench, the current of the coils goes down together, thus reducing or eliminating fringe field blooming.

Therefore, according to an embodiment of the present invention, an MRI apparatus includes a magnetic resonance imaging (MRI) system having a plurality of gradient coils positioned about a bore of a superconducting magnet to impress a polarizing magnetic field and an RF transceiver system and an RF switch controlled by a pulse module to transmit RF signals to an RF coil assembly to acquire MR images. The superconducting magnet includes a plurality of superconducting magnet coils. The MRI apparatus also includes a computer readable storage medium having stored thereon a computer program comprising instructions which when executed by a computer cause the computer to detect a quench condition of the superconducting magnet. The instructions also cause the computer to actively control a quench protection system of the superconducting magnet in response to the detected quench condition.

According to another embodiment of the present invention, a method of actively quenching a superconducting magnet includes detecting a quench voltage in a first portion of a superconducting magnet and energizing a quench protection system thermally connected to a second portion of the superconducting magnet. The method also includes heating the second portion of the superconducting magnet via the energized quench protection system to a temperature greater than a superconducting temperature of the superconducting magnet.

According to a further embodiment of the present invention, a superconducting magnet system includes a superconducting magnet and at least one heater in thermal contact with the superconducting magnet. The system also includes a heater power source and an electrical bridge having an input configured to cause the electrical bridge to make and break an electrical connection between the at least one heater and the heater power source. A controller is coupled to the superconducting magnet and coupled to the input.

The present invention has been described in terms of the preferred embodiment, and it is recognized that equivalents, alternatives, and modifications, aside from those expressly stated, are possible and within the scope of the appending claims.

What is claimed is:

1. A superconducting magnet system comprising:
    a superconducting magnet;
    at least one heater in thermal contact with the superconducting magnet;
    a heater power source;
    an electrical bridge having an input configured to cause the electrical bridge to make and break an electrical connection between the at least one heater and the heater power source;
    a controller coupled to the superconducting magnet and coupled to the input, wherein the controller is programmed to:
        receive a voltage signal from the superconducting magnet;
        determine, based on the received voltage signal, if the superconducting magnet has quenched; and
        cause the electrical bridge to make the electrical connection if the superconducting magnet has quenched.

2. The superconducting magnet system of claim 1 wherein the controller is further programmed to:
    receive the voltage signal from the superconducting magnet during a magnet ramp; and
    compare the voltage signal received during the magnet ramp to a threshold.

3. The superconducting magnet system of claim 1 wherein the controller is further programmed to:
    receive the voltage signal from the superconducting magnet during normal operations of the superconducting magnet;
    integrate the voltage signal received during the normal operations; and
    compare the integrated voltage to a threshold.

4. A superconducting magnet system comprising:
    a superconducting magnet;
    at least one heater in thermal contact with the superconducting magnet;
    a heater power source;
    an electrical bridge having an input configured to cause the electrical bridge to make and break an electrical connection between the at least one heater and the heater power source;
    a controller coupled to the superconducting magnet and coupled to the input; and a manual switch connected to the at least one heater and connected to the heater power source, the manual switch configured to make and break an electrical connection between the at least one heater and the heater power source.

5. The superconducting magnet system of claim 4 wherein the controller is programmed to:
receive a voltage signal from the superconducting magnet;
determine, based on the received voltage signal, if the superconducting magnet has quenched; and
cause the electrical bridge to make the electrical connection if the superconducting magnet has quenched.

6. The superconducting magnet system of claim 5 wherein the controller is further programmed to:

receive the voltage signal from the superconducting magnet during a magnet ramp; and
compare the voltage signal received during the magnet ramp to a threshold.

7. The superconducting magnet system of claim 5 wherein the controller is further programmed to:
receive the voltage signal from the superconducting magnet during normal operations of the superconducting magnet;
integrate the voltage signal received during the normal operations; and
compare the integrated voltage to a threshold.

* * * * *